(12) United States Patent
Kambe et al.

(10) Patent No.: US 6,323,439 B1
(45) Date of Patent: Nov. 27, 2001

(54) METAL CORE MULTILAYER RESIN WIRING BOARD WITH THIN PORTION AND METHOD FOR MANUFACTURING THE SAME

(75) Inventors: Rokuro Kambe, Nagoya; Toru Matsuura, Inuyama, both of (JP)

(73) Assignee: NGK Spark Plug Co., Ltd., Aichi-ken (JP)

( * ) Notice: Subject to any disclaimer, the term of this patent is extended or adjusted under 35 U.S.C. 154(b) by 0 days.

(21) Appl. No.: 09/386,334

(22) Filed: Aug. 31, 1999

(30) Foreign Application Priority Data

Sep. 24, 1998 (JP) .................................. 10-269460

(51) Int. Cl.⁷ ..................... H01R 9/09; H05K 1/11; H01K 3/10
(52) U.S. Cl. .................. 174/262; 174/266; 174/255; 361/803; 29/852
(58) Field of Search .................... 174/262, 263, 174/264, 265, 266, 255; 361/803, 780, 792, 793, 794, 795; 257/698; 29/852

(56) References Cited

U.S. PATENT DOCUMENTS

| | | |
|---|---|---|
| 5,056,216 * | 10/1991 | Madou et al. ................ 29/843 |
| 5,626,771 | 5/1997 | Davis et al. |
| 6,013,948 * | 1/2000 | Akram et al. ................ 257/698 |

FOREIGN PATENT DOCUMENTS

| | | |
|---|---|---|
| 1-206696 | 8/1989 | (JP) . |
| 2-246298 | 10/1990 | (JP) . |
| 8-23165 | 1/1996 | (JP) . |
| 8-70186 | 3/1996 | (JP) . |

* cited by examiner

Primary Examiner—K Cuneo
(74) Attorney, Agent, or Firm—Finnegan, Henderson, Farabow, Garrett & Dunner, L.L.P.

(57) ABSTRACT

A multilayer resin wiring board includes a metal core substrate having a first main surface and a second main surface; a plurality of wiring layers located on the first and second main surfaces of the metal core substrate; a plurality of insulating resin layers, each intervening between the metal core substrate and the wiring layers and between the metal core substrate and the wiring layers and between the wiring layers; and a via formed on the wall of a through hole for connection to the metal core substrate extending through the insulating resin layers and the metal core substrate so as to establish electrical conductivity to the metal core substrate. The metal core substrate has a thin portion which is thinner than the remaining portion of the metal core substrate. The through hole for connection to the metal core substrate is formed through the thin portion by laser machining.

17 Claims, 5 Drawing Sheets

METAL CORE MULTILAYER RESIN WIRING BOARD WITH THIN PORTION AND METHOD FOR MANUFACTURING THE SAME

BACKGROUND OF THE INVENTION

1. Field of the Invention

The present invention relates to a multilayer resin wiring board including a metal core substrate, wiring layers, and intervening insulating resin layers, and to a method for manufacturing the same. More particularly, the invention relates to a multilaye resin wiring board including a metal core substrate having a through hole formed therer in and to a method for manufacturing the same.

2. Description of the Related Art

Multilayer resin wiring boards are generally known to include alternately-arrranged insulating resin layers and wiring layers and can further include a single or a plurality of metal core substrates. For example, the prior art describes multilayer resin wiring board that include a metal core substrate, insulating resin layers and wiring layers which are alternately arranged on upper and lower sides of the metal core substrate, wherein the metal core substrate of such wiring boards is brought to the grounding potential or a power source potential.

When such a metal core substrate is used and is to be electrically connected to two wiring layers located on its opposite sides, a through hole is drilled in the metal cor substrate and insulating resin layers located on opposite sides of the metal core substrate. A via connected to the metal core substrate is formed on the wall of the through hole, thereby establishing electrical connection among the wiring layers and the metal core substrate.

In order to meet demand for fine patterns, compactness, and high degree of integration of printed wiring to be formed on a resin wiring board, the diameter of through holes has been decreased. When through holes are formed by drilling, however, a long period of time is required. The long drilling time coupled with the very small diameter of the through holes results in an increased possibility of breakage of the drill. Particularly, when the diameter of a through hole is to be less than 200 $\mu$m (0.2 mm), drilling becomes significantly difficult. In addition, wear to the cutting edge requires that the drill be replaced after a predetermined number of holes are drilled or total drilling time reaches a predetermined length.

To avoid the above-mentioned problems, the inventors have proposed machining of through holes. In particular, the inventors propose using an ultraviolet laser such as the fourth harmonic of a YAG laser to bore a through hole in insulating resin layers and a metal core substrate, such as a copper core substrate. Laser machining can easily bore finer through holes, e.g., 50 $\mu$m or smaller, than drilling. Further, laser machining does not result in breakage or replacement of drills and can improve boring speed and accuracy of boring position, thereby enabling micromachining.

In the case of a multilayer resin wiring board (hereinafter simply referred to as a PWB) insulating layers of a resin or a resin-containing composite material and thin (10 $\mu$m to 20 $\mu$m) wiring layers are alternately arranged on a thin (for example, 20 $\mu$m or 35 $\mu$m thick) metal core substrate. However, rigidity is sacrificed when using such thin layers and could result in bending or deformation of the PWB. Consequently, when electronic devices (for example, integrated-circuit chips) are mounted on the PWB, stress is applied to a connection between the PWB and an electronic device due to deformation of the PWB, potentially resulting in breakage of the connected portion.

In order to prevent this problem, a relatively thick (not less than 50 $\mu$m thick; e.g., 100 $\mu$m or 200 $\mu$m thick) metal core substrate may be used in an attempt to improve the rigidity of the entire PWB. Unlike a thin metal core substrate which is likely to deform, wrinkle or fold and is thus difficult to handle, a thick metal core substrate is easy to handle and hardly wrinkles, which is an advantageous during processing. However, it is difficult to bore through holes in a thick metal core substrate therein by laser machining. Namely, the time required for boring a through hole in a thick metal core substrate becomes excessively long, resulting in a significant increase in machining man-hours. Further, heat generated during laser machining causes an increase ir resin smear, further resulting in an inability to accurately bore a fine through hole, which ultimately causes deterioration of the insulating resin layer at a portion around the bored through hole.

SUMMARY OF THE INVENTION

In view of the foregoing, an object of the present invention is to provide a multilayer resin wiring board configured such that wiring layers and insulating resin layers are alternately arranged on a metal core substrate. The metal core substrala of the present invention is relatively thick so as to impart high rigidity to the PWB, but enables, with a high degree of accuracy, the formation of a fine through hole in the PWB by short-time laser machining. As a result, a via is formed for establishing electrical connection among the metal core substrate and the wiring layers.

Another object of the present invention is to provide a method of manufacturing the multilayer resin wiring board. To achieve the above object, the present invention provides a multilayer resin wiring board comprising:
- a metal core substrate having a first main surface and a second main surface;
- a plurality of wiring layers located on the first and second main surfaces of the metal core substrate;
- a plurality of insulating resin layers, each intervening between the metal core substrate and the wiring layers, or between the metal core substrate and the wiring layers and between the wiring layers; and
- a via formed on a wall of a through hole.

The via connects the metal core substrate extending through the insulating resin layers and the metal core substrate so as to establish electrical conductivity to the metal core substrate (hereinafter referred to as a "via connected to the metal core substrate"). The metal core substrate has a thin portion which is thinner than a remaining portion of the metal core substrate, and the through hole for connection to the metal core substrate is formed through the thin portion. The through hole is preferably formed by laser machining.

To increase the rigidity of the metal core substrate and thus facilitate the handling and yield, portions of the metal core substrate of the present PWB, other than the thin portion, can be rendered relatively thick. Since an increase in the rigidity of the metal core substrate leads to an increase in the rigidity of the multilayer resin wiring board, the board hardly warps, undulates, or deforms, thereby establishing reliable connection to electronic devices, such as IC chips, and other resin wiring boards, such as a mother board or a junction board. When the through hole for connection to the metal core substrate is formed by laser machining, fine thin holes can be formed a high speed and at a high degree of accuracy as in the case of formation of through holes in a thin metal core substrate. Further, deterioration of the insulating resin layer at a portion around the bored through hole can be suppressed. Accordingly, the multililayer resin wiring board obtained from the present invention has a low cost and high rigidity while further having highly accurate, fine vias connected to the metal core substrate.

The present invention also provides a method for manufacturing a multilayer resin wiring board that includes the steps of:

preparing a metal core substrate having a thin portion;

forming a plurality of wiring layers and a plurality of insulating resin layers on a first main surface and a second main surface of the metal core substrate such that the insulating resin layer intervenes between the metal core substrate and the wiring layers, or between the metal core substrate and the wiring layers and between the wiring layers;

forming a through hole for connection to the metal core substrate by laser machining such that the through hole extends through the insulating resin layers and the thin portion of the metal core substrate which is thinner than the remaining portion; and forming a via on the wall of the through hole for establishing electrical conductivity to the metal core substrate.

In the method for manufacturing a multilayer resin wiring board according to the present invention, the through hole for connection to the metal core substrate is formed by laser machining such that the through hole extends through the insulating resin layers and the thin portion of the metal core substrate. Since the thin portion is bored during the laser machining, the portions other than the thin portion can be rendered thick to facilitate handling of the metal core substrate and improve yield. Further, since the laser machining can be performed easily and quickly, cost of production decreases, and deterioration of the insulating resin layer around the bored through hole can be suppressed. Moreover, it is possible to manufacture multilayer resin wiring boards having increased rigidity.

BRIEF DESCRIPTION OF THE DRAWINGS

Various other objects, features and advantages of the present invention will be readily appreciated by reference to the following detailed description of the preferred embodiments when considered in connection with the accompanying drawings, in which.

DESCRIPTION OF THE INVENTION AND THE PREFERRED EMBODIMENT

Figure 1:
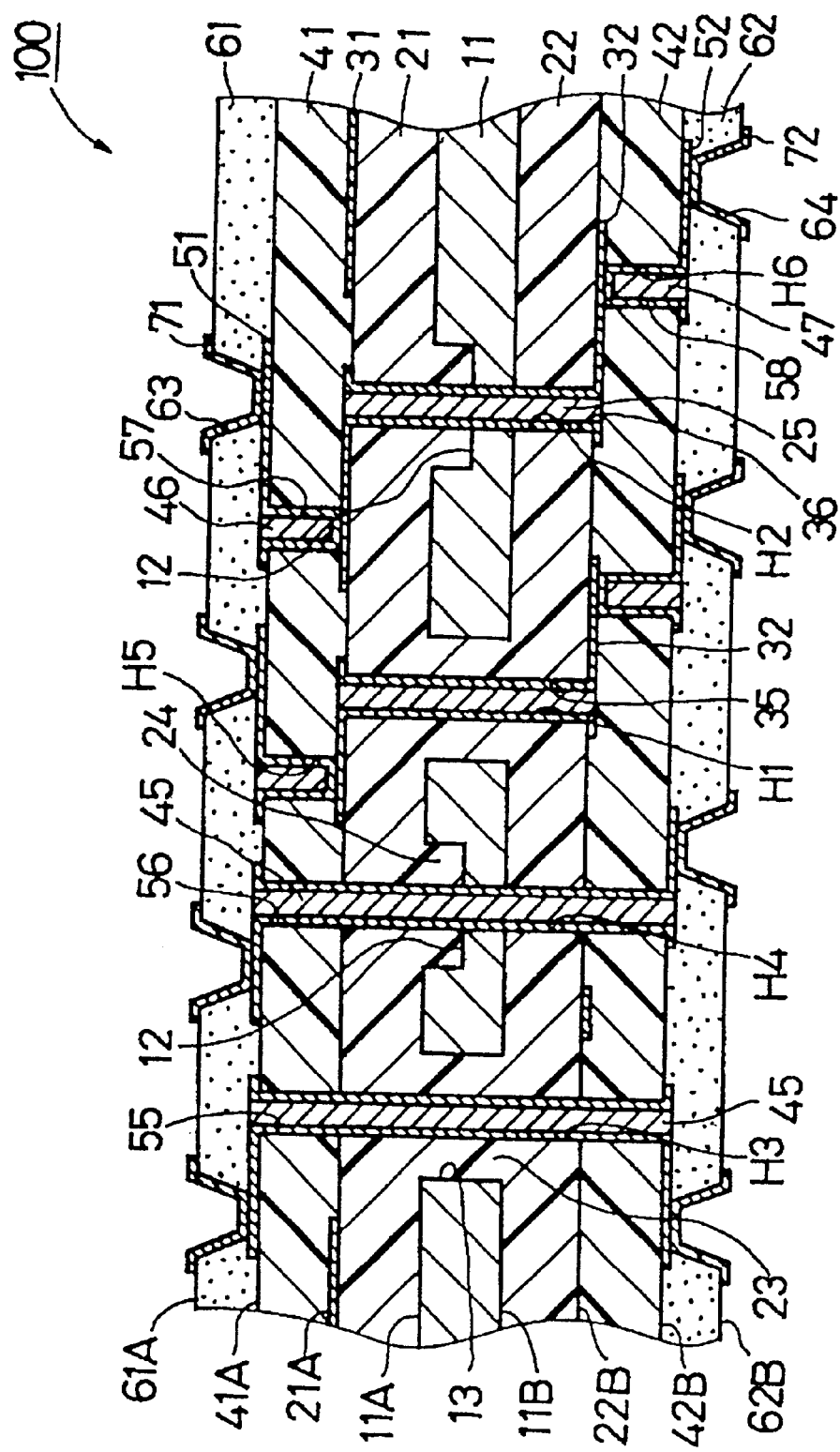
FIG. 1 is a partially enlarged cross-sectional view showing a multilayer resin wiring board according to an embodiment of the present invention.

A multilayer resin wiring board according to the present invention comprises:

a metal core substrate having a first main surface and a second main surface;

a plurality of wiring layers located on the first and second main surfaces of the metal core substrate;

a plurality of insulating resin layers, each intervening between the metal core substrate and the wiring layers, or between the metal core substrate and the wiring layers and between the wiring layers;

and a via formed on a wall of a through hole for connection to the metal core substrate extending through the insulating resin layers and the metal core substrate so as to establish electrical conductivity to the metal core substrate, wherein the metal core substrate has a thin portion which is thinner than a remaining portion of the metal core substrate; and the through hole for connection to the metal core substrate is formed through the thin portion.

The through hole for connection to the metal core substrate is preferably formed by laser machining. In view of its electrical conductivity properties, laser machinability, and cost, among other factors, the metal core substrate may include copper or copper alloy.

Material for the insulating resin layer may be selected because of its insulating property, heat resistance, moisture resistance, and laser machinability. Examples of such materials include resins such as an epoxy resin, a polyimide resin, a BT resin, or PPE resin; composite materials, such as composites of any of the resins and glass fiber (glass woven fabric or glass unwoven fabric) or composites of any of the resins and organic fiber, such as polyamide fiber; and resin-resin composite materials formed by, for example, impregnating a three-dimensional network fluorine-containing resin base material, such as continuously porous PTFE, with a thermosetting resin, such as an epoxy resin.

The material or structure of the wiring layers may be selected because of its electrical conductivity or adhesion with the insulating resin layer. For example, the wiring layers may be formed from copper or nickel or may assume a double structure comprising a copper layer and a nickel layer. The wiring layers may be formed by a known process, such as a subtractive process, a semi-additive process, or a fully-additive process. These processes may employ, for example, electroless copper plating or copper electroplating, or electroless nickel plating or nickel electroplating.

The requirement for the via connected to the metal core substrate is that it be formed on the wall of a through hole extending through the metal core substrate such that an electrical connection to the metal core substrate is established. In one embodiment, the via is used to connect the metal core substrate and two wiring layers located on opposite sides of the metal core substrate, i.e., the metal core substrate, a wiring layer located on the first main surface side, and a wiring layer located on the second main surface side. However, elements to be connected by the via by way of the metal core substrate are not limited to the wiring layers, but may include a connection terminal, such as a pad, or any other element. For example, the via may connect a wiring layer located on the first main surface side, a pad located on the second main surface side, and the metal core substrate. Alternatively, the via may connect a pad on the first main surface side, a pad on the second main surface side, and the metal core substrate.

Preferably, the metal core substrate has a thickness of not less than 50 $\mu$m, and the thin portion has a thickness of not greater than 25 $\mu$m. By using a metal core substrate with a thickness of not less than 50 $\mu$m, the metal core substrate increases in rigidity which makes it easy to handle, and less susceptible to wrinkling or marking with folds. Using a metal core substrate with a thickness of not greater than 25 $\mu$m for the thin portion reduces machining time (machining man-hours) in forming the through hole for connection to the metal core substrate by laser machining. Accordingly, throughput in manufacture of multilayer resin wiring boards can be increased. Furthermore, not only can a through hole for connection to the metal core substrate having a very small diameter be formed, but deterioration of the insulating resin layer at a portion around the bored through hole can be sufficiently suppressed. Therefore, through use of the above-described metal core substrate, the multilayer resin wiring board can be manufactured at low cost while assuming high rigidity.

Preferably, the metal core substrate has a thickness of not less than 50 $\mu$m, and the through hole for connection to the metal core substrate has a diameter of not greater than 50 $\mu$m. By using a metal core substrate with a thickness of not less than 50 $\mu$m, rigidity and thus handling of the metal core substrate is improved. Use of the thin portion further enables formation of a through hole not greater than 50 $\mu$m in diameter, which is usually too small to be employed with a metal core substrate having a thickness of not less than 50 $\mu$m. Restrictions on, for example, an insulation distance between through holes and an adjacent wiring layers are eased, thereby facilitating coexistence of through holes with wiring layers having fine wiring patterns and allowing the formation of PWB's with fine wiring patterns.

According to the present invention, a method for manufacturing a multilayer resin wiring board includes the steps of:

preparing a metal core substrate having a thin portion;

forming a plurality of wiring layers and a plurality of insulating resin layers on a first main surface and a second main surface of the metal core substrate such that the insulating resin layer intervenes between the metal core substrate and the wiring layers, or between the metal core substrate and the wiring layers and between the wiring layers;

forming a through hole for connection to the metal core substrate by laser machining such that the through hole extends through the insulating resin layers and the thin portion of the metal core substrate which is thinner than the remaining portion of the metal core substrate; and forming a via on the wall of the through hole for establishing electrical conductivity to the metal core substrate (a via connected to the metal core substrate).

Laser machining can bore the through hole for connection to the metal core substrate at a high degree of positioning accuracy. However, when laser machining is used to bore a laminate including the metal core substrate and insulating resin layers (and, in some cases, wiring layers), the thin layer of the metal core substrate should be formed with a high degree of accuracy. When a thin portion is formed on the metal core substrate at a relatively low degree of accuracy, the laser beam may land on a portion other than the thin portion, i.e., on a thick portion. Since laser machining is to bore the thin portion, the intended through hole may not be formed or may be formed unsatisfactorily.

The thin portion of the metal core substrate is preferably formed on the first main surface or the second main surface through photoetching. Photoetching can form the thin portion on the metal core substrate at a high degree of positioning accuracy. Accordingly, the through hole for connection to the metal core substrate can be formed and positioned reliably, so that multilayer resin wiring boards can be manufactured at a high degree of yield.

Preferably, in addition to the thin portion, the metal core substrate has a cutout extending therethrough between the first main surface and the second main surface.

In some cases, two wiring layers located on opposite sides of the metal core substrate must be connected while being insulated from the metal core substrate. Such connection can be affected by using the above-mentioned cutout formed in the metal core substrate. Specifically, a via is formed in such a manner as to extend through resin which fills the cutout, thereby being insulated from the metal core substrate (the via will be referred to as a "via insulated from the metal core substrate"). By using the via insulated from the metal core substrate, the two wiring layers can be connected easily while being insulated from the metal core substrate.

The cutout may be formed by photoetching, as in the case of the thin portior, or by drilling. The cutout may be formed concurrently with the thin portion, or before or after the thin portion is formed. Preferably, the thin portion and the cutout are formed concurrently by photoetching such that the thin portion is formed on either the first main surface or the second main surface while the cutout is formed from both the first and second main surfaces.

Since the thin portion and the cutout can be formed concurrently by photoetching, the unit cost of the metal core substrate can be reduced, thereby reducing the manufacturing cost of the multilayer resin wiring board. Also, the cutout can be formed at a high degree of positioning accuracy.

A preferred embodiment of the present invention will next be described in detail with reference to the drawings.

Referring to FIG. 1, a multilayer resin wiring board 100 includes a copper core substrate (metal core substrate) 11; insulating resin layers 21, 41, and 61 and wiring layers 31 and 51 which are alternately formed on a first main surface (upper surface) 11A of the copper core substrate 11; and insulating resin layers 22, 42, and 62 and wiring layers 32 and 52 which are alternately formed on a second main surface (lower surface) 11B of the copper core substrate 11.

The copper core substrate 11 is 105 $\mu$m thick and has cutouts 13, which are formed therein at predetermined positions by a method to be described later, and thin portions 12 (40 $\mu$m thick), which are formed to be lower than the upper surface 11A. A thickness of 105 $\mu$m imparts sufficient rigidity to the copper core substrate 11 so that the copper core substrate 11 hardly deforms even when an external force is applied thereto to some extent. Accordingly, the multilayer resin wiring board 100 increases in rigidity and hence hardly deforms.

Each of the insulating resin layers 21, 22, 41, and 42 has a thickness of 50 µm and is formed from a resin-resin composite material; specifically, a continuously porous PTFE impregnated with an epoxy resin. The concave space of the thin portion 12 and the cutout 13 are filled with an epoxy resin, thereby forming fillings 24 and 23, respectively. Insulating resin layers 61 and 62 each have a thickness of 40 µm and are formed from a photosensitive epoxy resin, which will be described later. The insulting resin layer 61 (62) has through holes 63 (64) extending therethrough. A concave pad 71 (72) is formed on the wall of each of the through holes 63 (64). Terminals of, for example, an unillustrated IC chip or mother board are connected to the pads 71 (72) through soldering. Each of the pads 71 (72) includes three layer; specifically, a copper plating layer, a nickel plating layer, and a gold flashing layer (these layers are not shown). In other words, the insulating resin layer 61 (62) also serves as a solder resist layer.

The wiring layers 31, 32, 51, and 52 are each formed from copper and have a thickness of about 15 µm, and predetermined wiring patterns are formed thereon. In order to connect the wiring layers 31 (32) and 51 (52), blind vias 57 (58) are formed in blind holes H5 (H6) having a diameter of 50 µm and formed in the insulating resin layer 41 (42). In order to connect the wiring layers 31 and 32 located on opposite sides of the copper core substrate 11 while the wiring layers 31 and 32 are insulated from the copper core substrate 11, a via 35 insulated from the copper core substrate (a via insulated from the metal core substrate) is formed on the wall of a through hole H1 fo insulation from the copper core substrate 11 (a through hole for insulation from the metal core substrate). The through hole H1 has a diameter of 50 µm and extends through the insulating resin layers 21 and 22 and the filling 23 which fills the cutout 13. The via 35 is formed from copper. Similarly, in order to connect the wiring layers 51 and 52, a via 55 insulated from the copper core substrate 11 is formed on the wall of a through hole H3 for insulation from the copper core substrate 11. The through hele H3 has a diameter of 50 µm and extends through the insulating resin layers 21, 22, 41, and 42 and the filling 23 which fills the cutout 13.

In order to connect the copper core substrate 11 and the wiring layers 31 a lid and 32, a via 36 connected to the copper core substrate (a via connected to the metal core substrate) is formed on the wall of a through hole H2 for connection to the copper core substrate 11 (a through hole for connection to the metal core substrate). The through hole H2 has a diameter of 50 µm and extends through the insulating resin layers 21 and 22, the filling 24, and the thin portion 12 of the copper core substrate 11. The via 36 is formed from copper and is thus connected to the copper core substrate 11, thereby establishing electrical conductivity to the copper core substrate 11. Similarly, in order to connect the copper core substrate 11 and the wiring layers 51 and 52, a via 56 connected to the copper core substrate is formed on the wall of a through hole H4 for connection to the copper core substrate 11. The through hole H4 has a diameter of 50 µm and extends through the insulating resin layers 21, 22, 41, and 42, the filling 24, and the thin portion 12 of the copper core substrate 11. The via 56 is formed fron copper and is thus connected to the copper core substrate 11, thereby establishing electrical conductivity to the copper core substrate 11. When an IC chip, for example, is mounted on the thus-configured board 100 and is fed with electricity, the copper core substrate 11 is brought to a predetermined potential (grounding potential or power source potential) through the vias 36 and 56 connected thereto and can serve as an element of common potential (common grounding or common power source). The through holes H1, H2, H3, and H4 are formed by laser machining which employs the fourth harmonic of YAG laser (ultraviolet laser).

Since the copper core substrate 11 is up to 105 µm thick, the rigidity of the board 100 is thereby increased making it easy to handle. Further, since the board 100 hardly deforms, even when an external force is applied to the board 100 upon attachment of an IC chip (not shown), for example, an associated stress applied to the connection between the IC chip and the board 100 becomes relatively small. As a result, the connection rarely suffers a problem with breakage. The through holes H1 and H3 for insulation from the copper core substrate 11 are formed by laser machining such that they extend through the corresponding fillings 23 which fill the cutouts 13. The through holes H2 and H4 for connection to the copper core substrate 11 are also formed by laser machining such that they extend through the corresponding thin portions 12. Accordingly, the through holes H2 and H4 can assume a diameter of less than 200 µm (50 µm in the present embodiment), which is seldom realized with a high degree of accuracy by drilling.

Figure 2A:
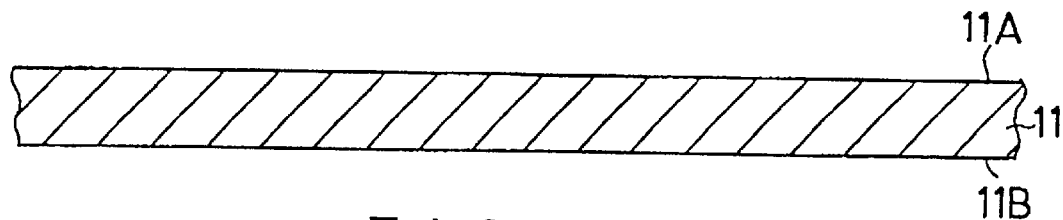
FIGS. 2A–2D are views depicting steps of a process for fabricating a copper core substrate.
Figure 2B:
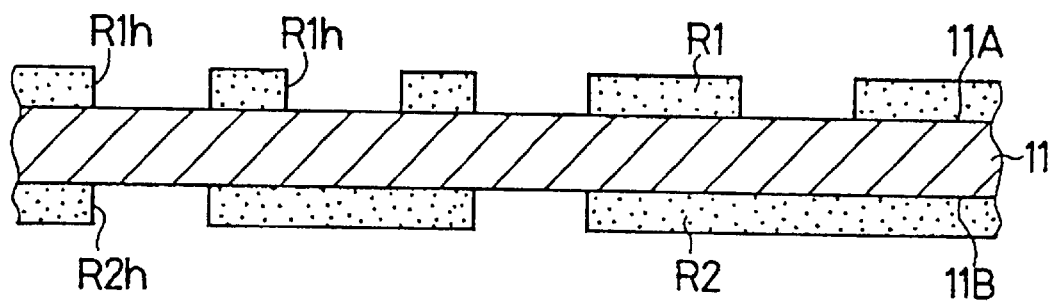
Figure 2C:
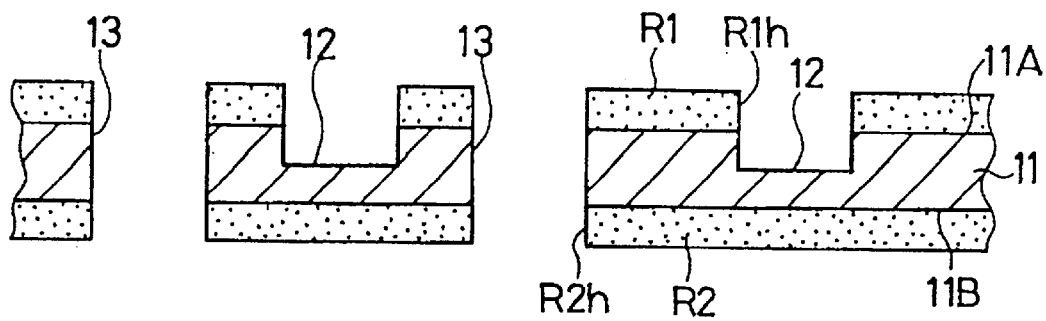
Figure 2D:
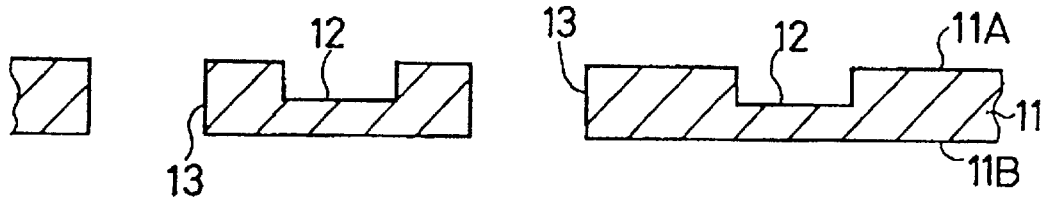

A method for manufacturing the multilayer resin wiring board 100 will next be described. First, fabrication of the copper core substrate 11 used in the board 100 is described with reference to FIGS. 2A to 2D. As shown in FIG. 2A, a blank coppe core substrate 11 having a thickness of 105 µm is prepared. As shown in FIG. 2B, photoresist is applied to the upper surface 11A and lower surface 11B of the blank copper core substrate 11. The photoresist layers are patterned as required through exposure and development. In this case, a pattern of a resist layer R1 formed on the upper surface 11A is rendered different from that of a resist layer R2 formed on the lower surface 11B. Specifically, the resist layer R1 is patterned such that an opening R1*h* is formed where the cutouts 13 and the thin portions 12 are to be formed, which will be described later. By contrast, the resist layer R2 is patterned such that the opening R2*h* is formed where the cutouts 12 are to be formed, but is not formed in regions corresponding to the thin portions 12. Subsequently, the blank copper core substrate 11 is subjected to etching. As shown in FIG. 2C, the cutouts 13 are formed by etching which is effected from both the upper and lower surfaces 11A and 11B (double-side etching). At the same time, the thin portions 12 are formed by etching which is only effected from the upper surface 11A (single-side etching). The thickness of the thin portion 12 can be controlled through adjustment of etching conditions (e.g., time and etchant temperature). In the present embodiment, etching conditions are adjusted so that the thin portions 12 become 40 µm thick. Subsequently, the resit layers R1 and R2 are dissolved and removed, yielding the copper core substrate 11 having the cutouts 13 and the thin portions 12 formed therein.

Since the thin portions 12 are formed by exposure and development of the photoresist and subsequent etching, i.e., by photoetching, the thin portions 12 can be located at a high degree of positioning accuracy, which can minimize defects associated with laser machining. For example, when the through holes H2 and H4 for connection to the copper core substrate 11 are formed in the corresponding thin portions 12 by laser machining, which will be described later, defects due to deviation of the thin portion 12 from an expected position, and resulting in the laser beam falling on a portion other than the thin portion 12 are avoided, thus avoiding through hole H2 (H4) which may not be formed or may be formed unsatisfactorily. Through formation of the cutouts 13 by double-side etching and formation of the thin portions 12 by single-side etching, the cutouts 13 and the thin portions 12 can be formed concurrently by a single step of photo-etching. Thus, the copper core substrate 11 can be fabricated at low cost. Also, the cutouts 13 and the thin portions 12 can be located at a high degree of positioning accuracy, and their relative positions can be established at a high degree of accuracy. Notably, the cutouts 13 and the thin portions 12 are not necessarily formed concurrently. Specifically, the cutouts 13 may be formed after the thin portions 12 are formed and vice verse.

Figure 3A:
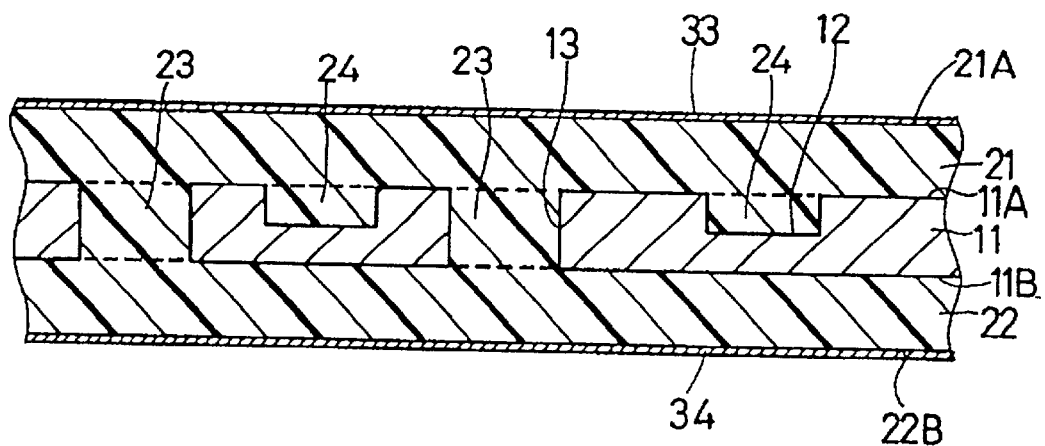
FIG. 3A is a view depicting a step of forming an insulating resin layer and a copper foil in layers on upper and lower sides of the copper core substrate in a process for manufacturing the multilayer resin wiring board of FIG. 1.

The method for fabricating the board 100 will be described further with reference to FIGS. 3A to 3G. As shown in FIG. 3A, a prepreg (not shown) and a copper foil 33 having a thickness of 20 μm are placed on the upper surface 11A of the copper core substrate 11, while a prepreg (not shown) and a copper foil 34 having a thickness of 20 μm are placed on the lower surface 11B. The prepreg is continuously porous PTFE impregnated with a semi-hard epoxy resin. The thus-prepared assembly is place in a vacuum hot press (not shown) and is subjected to thermo-compression bonding under vacuum, thereby curing the prepregs to obtain the insulating resin layers 21 and 22, each having a thickness of 50 μm. During thermo-compression bonding, the epoxy resin oozes out from the prepregs and fills the cutouts 13 and the concave thin portions 12 represented by the dashed line in FIG. 3A, thus forming the fillings 23 and 24.

Figure 3B:
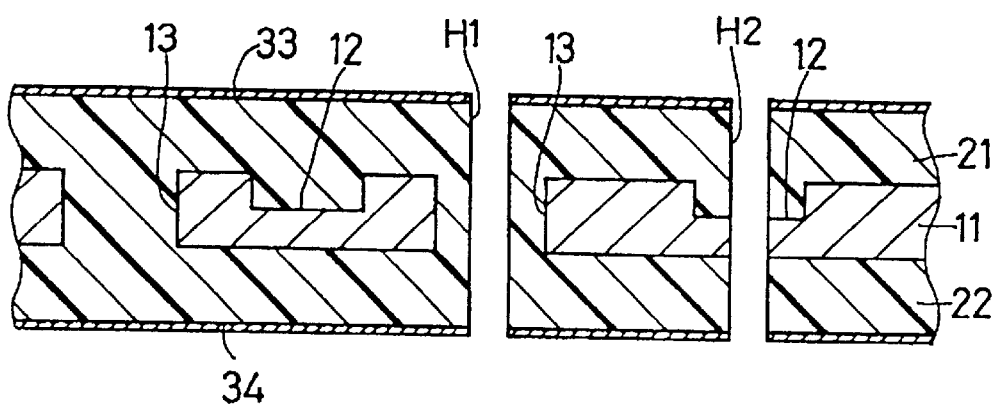
FIG. 3B is a view depicting a step of boring through holes through the copper foils, the insulating resin layers, and the copper core substrate by laser machining in the process for manufacturing the multilayer resin wiring board of FIG. 1.

Subsequently, as shown in FIG. 3B, the through hole H1 for insulation from the copper core substrate 11 having a diameter of 50 μm is bored through the copper foil 33, the insulating resin layer 21, the filling 23, the insulating resin layer 22, and the copper foil 34 by laser machining which employs the fourth harmonic (266 nm in wavelength) of a YAG laser. Since an ultraviolet laser is used, the through hole H1 can be bored through not only the resin but also the copper foils 33 and 34. Similarly, the through hole H2 for connection to the copper core substrate 11 having a diameter of 50 μm is bored through the copper foil 33, the insulating resin layer 21, the filling 24, the copper core substrate 11 (thin portion 12), the insulating resin layer 22, and the copper foil 34. Since an ultraviolet laser is used, the through hole H2 can be bored through the copper core substrate 11 as well as the copper foils 33 and 34. When the portion of the copper core substrate 11 to be bored is thick, boring consumes much time, and thus machining man-hours increase with a resultant increase in machining cost. Further, heat generated during machining is likely to deteriorate a portion of the insulating resin layer 21 or 22 or the filling 24 around the through hole H2 (particularly in the vicinity of the copper core substrate 11). By contrast, according to the present embodiment, since the thin portion 12 of the copper core substrate 11 is bored, machining time can be significantly reduced, while maintaining high rigidity of the copper core substrate 11. Also, potential problems in which the insulating resin layers 21 and 22, for example, are deteriorated due to heat of machining can be prevented.

Figure 3C:
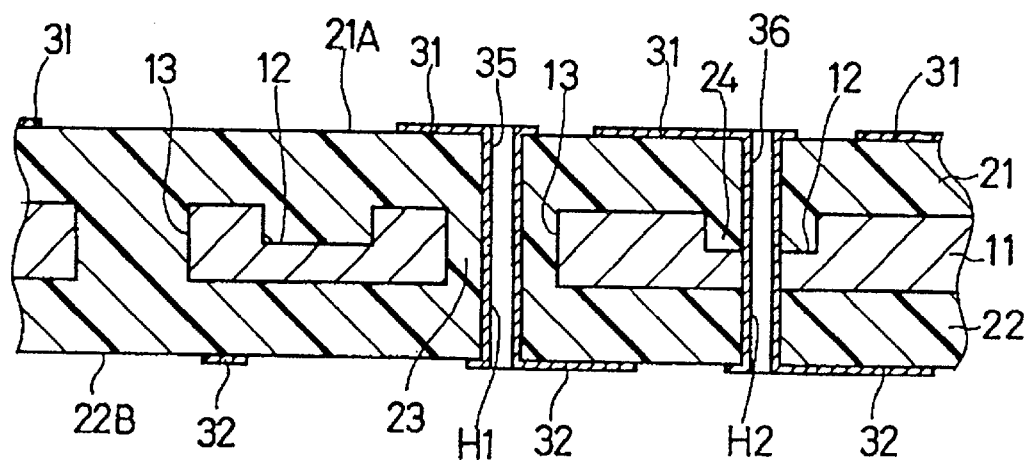
FIG. 3C is a view depicting a step of forming a via on the wall of each through hole and a wiring layers on the surface of each insulating resin layer in the process for manufacturing the multilayer resin wiring board of FIG. 1.

Next, as shown in FIG. 3C, according to a known process, the via 35 insulated from the copper core substrate 11 is formed on the wall of the through hole H1 for insulation from the copper core substrate 11, and the via 36 connected to the copper core substrate 11 is formed on the wall of the through hole H2 for connection to the copper core substrate 11. Being directly connected to the copper core substrate 11, the via 36 establishes electrical conductivity among the wiring layers 31 and 32 and the copper core substrate 11. The wiring layers 31 of a predetermined pattern is formed on the upper surface 21A (facing up in FIG. 3C) of the insulating resin layer 21, while the wiring layers 32 of a predetermined pattern is formed on the lower surface 22B (facing down in FIG. 3C) of the insulating resin layer 22. A process for forming the vias 35 and 36 and the wiring layers 31 and 32 is not depicted, but is briefly described below. Copper is deposited on the copper foils 33 and 34 and the walls of the through holes H1 and H2 by electroless copper plating, thereby forming an electroless copper plating layer. Subsequently, a resist of a predetermined pattern is formed on the electroless copper plating layer through exposure and development. Through copper electroplating, wherein the electroless copper plating layer is used as a common electrode, copper is further deposited on opening portions of the resist and on the walls of the through holes H1 and H2, thereby increasing the thickness of deposited copper. The resist is then dissolved and removed. Unnecessary portions of the electroless copper plating layer are removed by etching, thereby forming the wiring layers 31 and 32 and the vias 35 and 36.

Figure 3D:
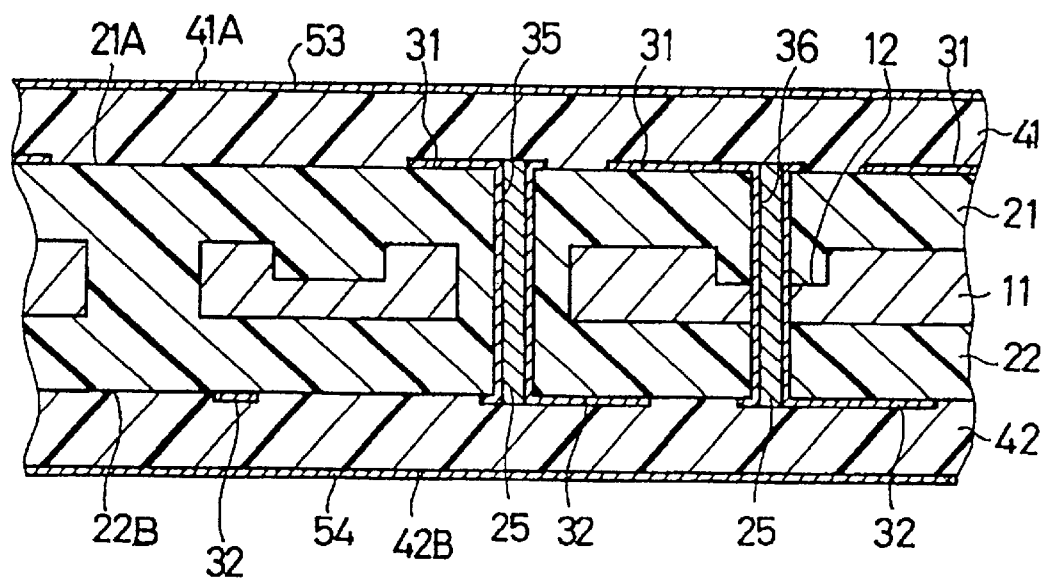
FIG. 3D is a view depicting a step of further forming insulating resin layers and copper foils in layers in a process for manufacturing the multilayer resin wiring board of FIG. 1.

Further, an epoxy resin is filled into the vias 35 and 36, followed by curing to form a plug 25. The aforementioned prepreg and a copper foil 53 are placed on the upper surface 21A of the insulating resin layer 21, while the prepreg and a copper foil 54 are placed on the lower surface 22B. The thus-prepared assembly is placed in the vacuum hot press and is subjected to thermo-compression bonding under vacuum, thereby forming the insulating resin layers 41 and 42 (50 μm thick each) covered with the copper foils 53 and 54 (20 μm thick each), respectively, as shown in FIG. 3D.

Figure 3E:
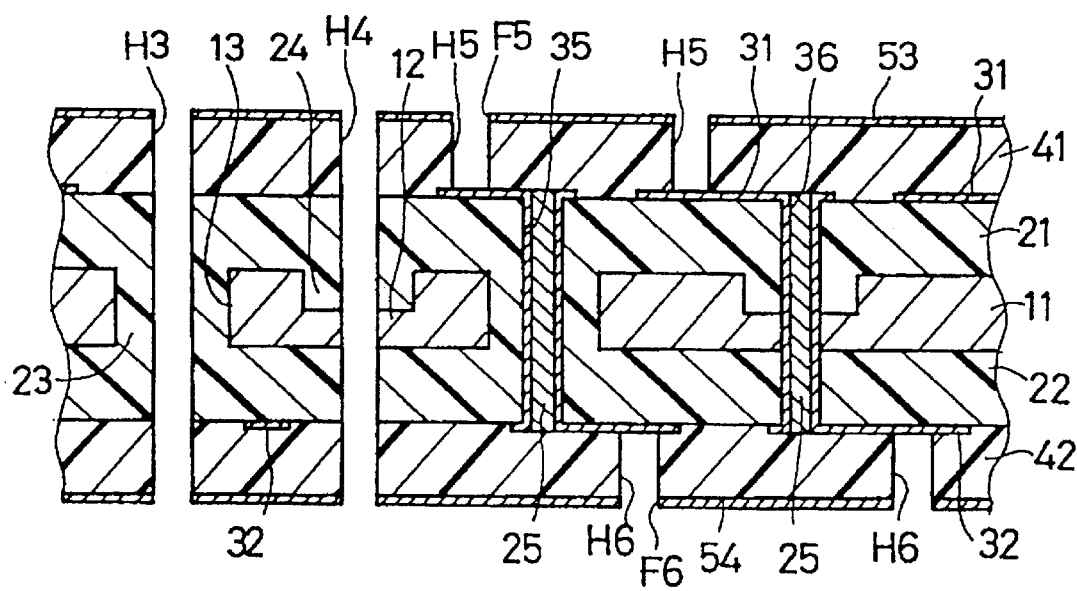
FIG. 3E is a view depicting a step of boring through holes through the copper foils, the insulating resin layers, and the copper core substrate by laser machining in the process for manufacturing the multilayer resin wiring board of FIG. 1.

Subsequently, as shown in FIG. 3E, the through holes H3 and H4 and the blind holes H5 and H6 are bored. The through holes H3 and H4 are bored by use of the fourth harmonic of a YAG laser as in the case of the through holes H1 and H2. Specifically, the through hole H3, which is for insulation from the copper core substrate 11 having a diameter of 50 μm, is bored by laser machining through the copper foil 53, the insulating resin layers 41 and 21, the filling 23, the insulating resin layers 22 and 42, and the copper foil 54. Similarly, the through hole H4 for connection to the copper core substrate 11 having a diameter of 50 μm, is bored through the copper foil 53, the insulating resin layers 41 and 21, the filling 24, the copper core substrate 11 (thin portion 12), the insulating resin layers 22 and 42, and the copper foil 54. According to the present embodiment, since the through hole H4 is bored in such a manner as to extend through the thin portion 12 of the copper core substrate 11, boring time can be significantly reduced, while maintaining high rigidity of the copper core substrate 11. Also, a potential problem in which the insulating resin layers 21 and 22, for example, are deteriorated due to heat of machining can be prevented.

The blind holes H5 (H6) are formed by the steps of forming through holes in the copper foil 53 (54) and removing underlying portions of the insulating resin layer 41 (42) by a conformal process. Specifically, through-holes H5 (H6) are formed in the copper foil 53 (54) by photoetching, so that the underlying insulating resin layer 41 (42) is exposed therethrough. Then, a third harmonic (355 nm) beam of a YAG laser or a beam of a carbon dioxide gas laser (10600 nm) is applied, while he copper foil 53 (54) having the through holes H5 (H6) serves as a mask, thereby forming the blind holes H5 (H6) in the insulating resin layer 41 (42). Since these lasers cannot remove copper, each of the blind holes H5 (H6) has a sectional shape (e.g., circle) similar to the shape of the through holes H5 (H6) and has a bottom formed by the wiring layers 31 (32) of copper.

Figure 3F:
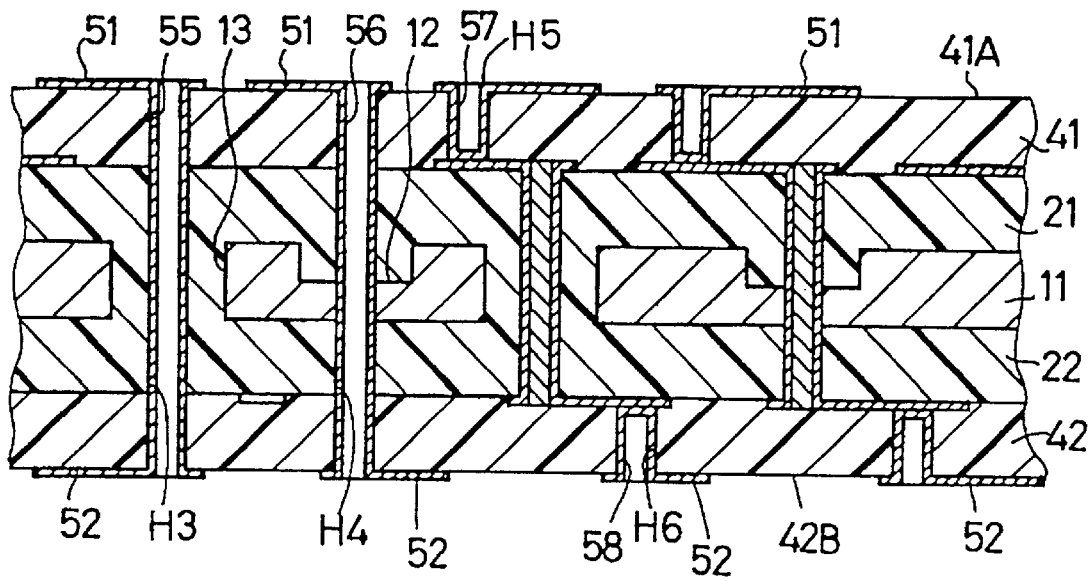
FIG. 3F is a view depicting a step of forming a via on the wall of each through hole and a wiring layers on the surface of each insulating resin layer in the process for manufacturing the multilayer resin wiring board of FIG. 1.

As shown in FIG. 3F, according to a known process, the via 55 insulated from the copper core substrate 11 is formed on the wall of the through hole H3 for insulation from the copper core substrate 11; the via 56 connected to the copper core substrate 11 is formed on the wall of the through hole H4 for connection to the copper core substrate 11; and the blind via 57 (58) is formed on the wall of the blind hole H5 (H6). The via 56 is directly connected to the copper core substrate 11 to thereby establish electrical conductivity therebetween. The wiring layers 51 of a predetermined pattern is formed on the upper surface 41A (facing up in FIG. 3F) of the insulating resin layer 41, while the wiring layers 52 of a predetermined pattern is formed on the lower surface 42B (facing down in FIG. 3F) of the insulating resin layer 42. A process for forming the vias 55 and 56 and the wiring layers 51 and 52 is similar to the above-described process for forming the vias 35 and 36 and the wiring layers 31 and 32.

Figure 3G:
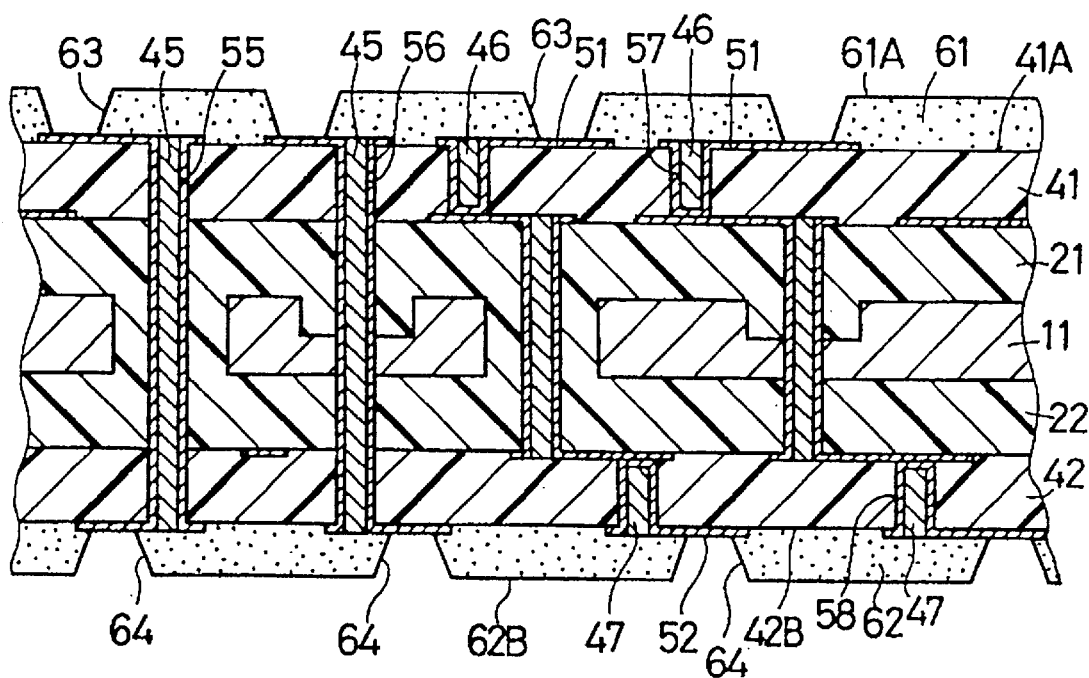
FIG. 3G is a view depicting a step of forming insulating resin layers (solder resist layers) into respectively predetermined patterns in the process for manufacturing the multilayer resin wiring board of FIG. 1.

Further, as shown in FIG. 3G, an epoxy resin is filled into the vias 55 and 56 and the blind vias 57 and 58, followed by curing to form plugs 45, 46, and 47. Subsequently, a photosensitive epoxy resin is deposited on the upper surface 41A of the insulating resin layer 41 and the lower surface 42B of the insulating resin layer 42, followed by exposure, development, and curing to form the insulating resin layers 61 and 62. The wiring layers 51 (52) is exposed at the bottom of the through hole 63 (64) formed in the insulating resin layer 61 (62).

Subsequently, the concave pad 71 (72) is formed on the wall of each of the through holes 63 (64) by the steps of copper plating, nickel plating, gold plating, and photoetching. Specifically, copper is deposited on the upper surface 61A (lower surface 62B) of the insulating resin layer 61 (62) by electroless copper plating, thereby forming an electroless copper plating layer. A photoresist layer of a predetermined pattern is formed on the electroless copper plating layer. Through copper electroplating, wherein the electroless copper plating layer is used as a common electrode, copper is deposited on opening portions of the photoresist, followed by nickel electroplating. The photoresist is then dissolved and removed. Unnecessary portions of the electroless copper plating layer are removed by etching, followed by formation a very thin electroless gold plating layer. The multilayer resin wiring board 100 of FIG. 1 is thus completed.

According to the manufacturing method described above, the vias 36 and 56 for connecting the wiring layers 31, 32, 51, and 52 to the copper core substrate 11 are formed through the thin portions 12 of the copper core substrate 11, thereby reducing laser machining man-hours and suppressing deterioration in the insulating resin layers 21 and 22. Laser machining can bore a fine through hole for connection to the copper core substrate having a diameter of less than 200 $\mu$m (50 $\mu$m in the present embodiment), which is difficult to realize with a high degree of accuracy by drilling. Therefore, the multilayer resin wiring board can be fabricated at low cost and at a high degree accuracy while maintaining high rigidity.

The present invention is not limited to the above-described embodiment. Numerous modifications and variations of the invention are possible without departing from the scope of the invention. For example, the above embodiment is described while mentioning the copper core substrate 11 whose thin portions 12 are formed by single-side etching which is affected from the upper surface 11A. However, the present invention is not limited thereto. The thin portions 12 may be formed by double-side etching which is affected from both the upper and lower surfaces 11A and 11B. In this case, if the cutouts 13 are to be formed, the cutouts 13 may be formed before or after the thin portions 12 are formed.

The wiring layers 31, 32, 51, and 52 and the vias 35, 36, 55, and 56 may be formed by a process different from that described above. For example, the wiring layers 31 and 32 may be formed by the steps of:

depositing copper on the copper foils 33 and 34 and the walls of the through holes H1 and H2 by electroless copper plating to form an electroless copper plating layer;

further depositing copper on the copper foils 33 and 34 and the walls of the through holes H1 and H2 by copper electroplating while the electroless copper plating layer is used as a common electrode, to thereby increase the thickness of deposited copper;

applying a resist and forming the applied resist to a predetermined pattern through exposure and development; and removing unnecessary portions by etching.

The above embodiment is described while mentioning a prepreg formed by impregnating continuously porous PTFE with an epoxy resin that is then cured to form the insulating resin layers 21, 22, 41, and 42. However, the present invention is not limited thereto, but other material may be used. For example, a composite material of glass fiber and an epoxy resin may be used.

The above embodiment uses the copper core substrate (metal core substrate) 11 which has a thickness of 105 $\mu$m and whose thin portion 12 has a thickness of 40 $\mu$m. Preferably, the thickness of the thin portion 12 may be further reduced to not greater than 25 $\mu$m while the thickness of the copper core substrate 11 is maintained at not less than 50 $\mu$m. By using a thickness of not less than 50 $\mu$m for the copper core substrate 11, the rigidity of the multilayer resin wiring board 100 can be held at a satisfactory level. Further, by reducing the thickness of the thin portion 12, the number of radiated pulses or machining man-hours can be drastically reduced, e.g., laser machining for boring the through holes H2 and H4 for connection to the copper core substrate 11 can be reduced. Therefore, through employment of a thickness of not greater than 25 $\mu$m for the thin portion 12, the number of machining man-hours can be sufficiently reduced. Also, the amount of heat generated in laser machining is reduced, thereby suppressing deterioration of the insulating resin layer at a portion around, for example, the through hole H2 for connection to the metal core substrate. Furthermore, finer through holes for connection to the metal core substrate can be formed and generation of smear can be suppressed during laser machining. Therefore, the multilayer printed wiring substrate of high rigidity can be manufactured at low cost.

The above embodiment uses a single copper core substrate 11. However a plurality of metal core substrates may be arranged in layers while an insulating layer is interposed therebetween. For example, two metal core substrates may be superpose on each other while an insulating layer is interposed therebetween. On opposite sides of the thus-formed laminate, insulating resin layers and wiring layers may be formed in layers. In this configuration, one metal core substrate serves as a common electrode having the grounding potential, and the other metal core substrate serves as a common electrode having a source potential. This configuration, therefore, facilitates appication of current to IC chips mounted on the board, for example.

The above embodiment is described while mentioning the via 36 which extends between the wiring layers 31 and 32 and is connected to the copper core substrate 11, and the via 56 which extends between the wiring layers 51 and 52 and is connected to the copper core substrate 11. However, the present invention is not limited thereto. The via connected to the copper core substrate may extend, for example, between a wiring layers and a pad or between pads.

In the above embodiment, a single via 36 (56) connected to the copper core substrate 11 is formed in a single thin portion 12. However, when a plurality of vias connected to the copper core substrate (vias connected to the metal core substrated) are to be formed adjacent to each other, the vias may be formed in a single thin portion.

In the above embodiment, the number of insulating resin layers 21, 41, 61 22, 42, 62 and wiring layers 31, 51, 32, 52 formed on one side of the copper core substrate 11 is identical to that on the other side. However, the number of insulating resin layers and wiring layers formed on the first main surface of the metal core substrate may be different from that on the second main surface.

What is claimed is:

1. A multilayer resin wiring board comprising:

a metal core substrate having a first main surface and a second main surface;

a plurality of wiring layers located on the first and second main surfaces of said metal core substrate;

a plurality of insulating resin layers, each intervening between said metal core substrate and said wiring layers, or between said metal core substrate and said wiring layers and between said wiring layers; and a via formed on a wall of a through hole for connection to said metal core substrate extending through said insulating resin layers and said metal core substrate so as to establish electrical conductivity to said metal core substrate;

wherein said metal core substrate has a thin portion which is thinner than a remaining portion of the metal core substrate, wherein the through hole for connection to said metal core substrate is formed through said thin portion.

2. A multilayer resin wiring board according to claim 1, wherein the through hole for connection to said metal core substrate is formed by laser machining.

3. A multilayer resin wiring board according to claim 2, wherein said metal core substrate has a thickness of not less than 50 $\mu$m, and the thin portion has a thickness of not greater than 25 $\mu$m.

4. A multilayer resin wiring board according to claim 2, wherein said metal core substrate has a thickness of not less than 50 $\mu$m, and the through hole for connection to said metal core substrate has a diameter of not greater than 50 $\mu$m.

5. A multilayer resin wiring board according to claim 3, wherein said metal core substrate has a thickness of not less than 50 $\mu$m, and the through hole for connection to said metal core substrate has a diameter of not greater than 50 $\mu$m.

6. A method for manufacturing a multilayer resin wiring board comprising the steps of:

preparing a metal core substrate having a thin portion;

forming a plurality of wiring layers and a plurality of insulating resin layers on a first main surface and a second main surface of the metal core substrate such that the insulating resin layer intervenes between the metal core substrate and the wiring layer, or between the metal core substrate and the wiring layers and between the wiring layers;

forming a through hole for connection to the metal core substrate by laser machining such that the through hole extends through the insulating resin layers and the thin portion of the metal core substrate which is thinner than a remaining portion of the metal core substrate; and forming a via on the wall of the through hole for establishing electrical conductivity to the metal core substrate such that said via is connected to the metal core substrate.

7. A method for manufacturing a multilayer resin wiring board according to claim 6, wherein said metal core substrate has a thickness of not less than 50 $\mu$m, and the thin portion has a thickness of not greater than 25 $\mu$m.

8. A method for manufacturing a multilayer resin wiring board according to claim 6, wherein said metal core substrate has a thickness of not less than 50 $\mu$m, and the through hole for connection to said metal core substrate has a diameter of not greater than 50 $\mu$m.

9. A method for manufacturing a multilayer resin wiring board according to claim 6, wherein the thin portion of the metal core substrate is formed on at least the first main surface or the second main surface through photoetching.

10. A method for manufacturing a multilayer resin wiring board according to claim 9, wherein said metal core substrate has a thickness of not less than 50 $\mu$m, and the thin portion has a thickness of not greater than 25 $\mu$m.

11. A method for manufacturing a multilayer resin wiring board according to claim 9, wherein said metal core substrate has a thickness of not less than 50 $\mu$m, and the through hole for connection to said metal core substrate has a diameter of not greater than 50 $\mu$m.

12. A method for manufacturing a multilayer resin wiring board according to claim 9, wherein, in addition to the thin portion, the metal core substrate has a cutout extending therethrough between the first main surface and the second main surface.

13. A method for manufacturing a multilayer resin wiring board according to claim 12, wherein said metal core substrate has a thickness of not less than 50 $\mu$m, and the thin portion has a thickness of not greater than 25 $\mu$m.

14. A method for manufacturing a multilayer resin wiring board according to claim 12, wherein said metal core substrate has a thickness of not less than 50 $\mu$m, and the through hole for connection to said metal core substrate has a diameter of not greater than 50 $\mu$m.

15. A method for manufacturing a multilayer resin wiring board according to claim 12, wherein the thin portion and the cutout are formed concurrently by photoetching such that the thin portion is formed on either the first main surface or the second main surface while the cutout is formed from both the first and second main surfaces.

16. A method for manufacturing a multilayer resin wiring board according to claim 9, wherein said metal core substrate has a thickness of not less than 50 $\mu$m, and the thin portion has a thickness of not greater than 25 $\mu$m.

17. A method for manufacturing a multilayer resin wiring board according to claim 9, wherein said metal core substrate has a thickness of not less than 50 $\mu$m, and the through hole for connection to said metal core substrate has a diameter of not greater than 50 $\mu$m.

* * * * *

UNITED STATES PATENT AND TRADEMARK OFFICE
CERTIFICATE OF CORRECTION

PATENT NO.    : 6,323,439 B1
DATED         : November 27, 2001
INVENTOR(S)   : Rokuro Kambe and Toru Matsuura It is certified that error appears in the above-identified patent and that said Letters Patent is hereby corrected as shown below:

<u>Column 14,</u>
Line 1, "layer" should read -- layers --.

Signed and Sealed this

Tenth Day of September, 2002

*Attest:*

*Attesting Officer*

JAMES E. ROGAN
*Director of the United States Patent and Trademark Office*

UNITED STATES PATENT AND TRADEMARK OFFICE
CERTIFICATE OF CORRECTION

PATENT NO.   : 6,323,439 B1
DATED        : November 27, 2001
INVENTOR(S)  : Rokuro Kambe and Toru Matsuura It is certified that error appears in the above-identified patent and that said Letters Patent is hereby corrected as shown below:

<u>Column 14,</u>
Lines 55 and 59, "claim 9" should read -- claim 15 --.

Signed and Sealed this

Twenty-fourth Day of August, 2004

JON W. DUDAS
*Director of the United States Patent and Trademark Office*